(12) United States Patent
Lee et al.

(10) Patent No.: US 8,089,003 B2
(45) Date of Patent: Jan. 3, 2012

(54) PRINTED CIRCUIT BOARD ASSEMBLY

(75) Inventors: Wen-Chin Lee, Taoyuan (TW);
Cheng-Hsien Lin, Taoyuan (TW)

(73) Assignee: Zhen Ding Technology Co., Ltd.,
Tayuan, Taoyuan (TW)

( * ) Notice: Subject to any disclaimer, the term of this patent is extended or adjusted under 35 U.S.C. 154(b) by 950 days.

(21) Appl. No.: 12/057,654

(22) Filed: Mar. 28, 2008

(65) Prior Publication Data

US 2009/0050354 A1 Feb. 26, 2009

(30) Foreign Application Priority Data

Aug. 24, 2007 (CN) .............. 2007 1 0076565

(51) Int. Cl.
*H05K 1/02* (2006.01)

(52) U.S. Cl. ....................................... 174/256

(58) Field of Classification Search .......... 174/256, 174/268
See application file for complete search history.

(56) References Cited

U.S. PATENT DOCUMENTS

| 3,507,978 | A | * | 4/1970 | Jachimowicz | ........... 174/105 R |
| 3,594,492 | A | * | 7/1971 | Bahder et al. | .................... 174/36 |
| 4,125,739 | A | * | 11/1978 | Bow | ............................ 174/36 |
| 4,550,357 | A | * | 10/1985 | Matsumoto | .................... 361/749 |
| 4,774,148 | A | * | 9/1988 | Goto | ............................... 428/607 |
| 2004/0192082 | A1 | * | 9/2004 | Wagner et al. | ................. 439/67 |
| 2007/0277375 | A1 | * | 12/2007 | Takano et al. | ................... 29/846 |

* cited by examiner

*Primary Examiner* — Chau Nguyen
(74) *Attorney, Agent, or Firm* — Altis Law Group, Inc.

(57) ABSTRACT

A printed circuit board substrate includes an insulation matrix and a waterproof layer. The insulation matrix includes a first surface and a second surface at an opposite side thereof to the first surface. The waterproof layer is formed in the insulation matrix and is arranged between the first surface and the second surface for blocking water from passing therethrough in a thicknesswise direction of the insulation matrix.

1 Claim, 5 Drawing Sheets

PRINTED CIRCUIT BOARD ASSEMBLY

BACKGROUND OF THE INVENTION

1. Field of the Invention

The present invention relates to flexible printed circuit boards (PCBs) and, particularly, to a printed circuit board substrate and a printed circuit board having the same.

2. Description of Related Art

Nowadays, flexible printed circuit boards (FPCBS) are widely used in portable electronic devices such as mobile phones, digital cameras, and personal digital assistants (PDAS). In some electronic devices, certain parts are movable relative to a main body. In these electronic devices, FPCBS can maintain an electrical connection between the main body and the movable parts due to their flexibility.

FPCBS can be manufactured by at least a base film using a wetting process, such as cleaning, developing, etching, electro-plating, etc. The base film includes an insulation film and a copper film. For example, a process for manufacturing electrical traces of the FPCB includes the following steps. Firstly, the base film is cleaned in a cleaning solution to remove surface oils of the copper film. Secondly, a photo-resist layer is formed on the surface of the copper film. Thirdly, the photo-resist layer is exposed to a light beam using a mask having a predetermined pattern. Thus, one portion of photo-resist layer is covered by the mask, and the other portion of photo-resist layer is not covered and irradiated by the light beam. When the photo-resist layer is made of a positive photo-resist, the uncovered photo-resist layer (i.e. the exposed photo-resist layer) is changed to be soluble in a developing agent. Fourthly, the base film having the photo-resist layer is developed in the developing agent. During the developing process, the exposed photo-resist layer is dissolved in the developing agent, and the residual photo-resist layer forms a patterned photo-resist layer. Thus, one portion of the copper film is covered by the pattered photo-resist layer, and the other portion of the copper film is exposed to the outside. Fifthly, the base film having the patterned photo-resist layer is arranged in an etching solution, and the copper film not covered by the photo-resist layer is dissolved by the etching solution. As a result, the residual copper film covered by the photo-resist layer forms a copper trace. Finally, the photo-resist layer covering the copper trace is eliminated, thereby obtaining the desired electrical traces of the FPCB.

In the process mentioned above, the base film is exposed in liquid solutions (e.g., the cleaning solution, the developing agent, the etching solution) repeatedly, and the liquid solution may inevitably penetrate into the base film. Thus, an original characteristic of the base film may be changed, thereby affecting the quality of the FPCB manufactured by such base film. Furthermore, when the copper film is made into copper traces, molecules (e.g., water molecules) or other ions of the liquid solution may migrate from the insulation film to the copper traces to react with the copper traces. That is, an ion migration phenomena has happened between the insulation film and the copper traces. As a result, a quality of the copper traces may be affected, e.g., causing an open circuit phenomena or a short circuit phenomena.

What is need, therefore, is PCB substrate which can resist/avoid the happening of the ion migration phenomena. What is also need is a PCB having the PCB substrate.

SUMMARY OF THE INVENTION

An embodiment of printed circuit board substrate includes an insulation matrix and a waterproof layer. The insulation matrix includes a first surface and a second surface at an opposite side thereof to the first surface. The waterproof layer is formed in the insulation matrix and is arranged between the first surface and the second surface for blocking water from passing therethrough in a thicknesswise direction of the insulation matrix.

Advantages and novel features will become more apparent from the following detailed description when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Embodiments will now be described in detail below and with reference to the drawings.

Figure 1:
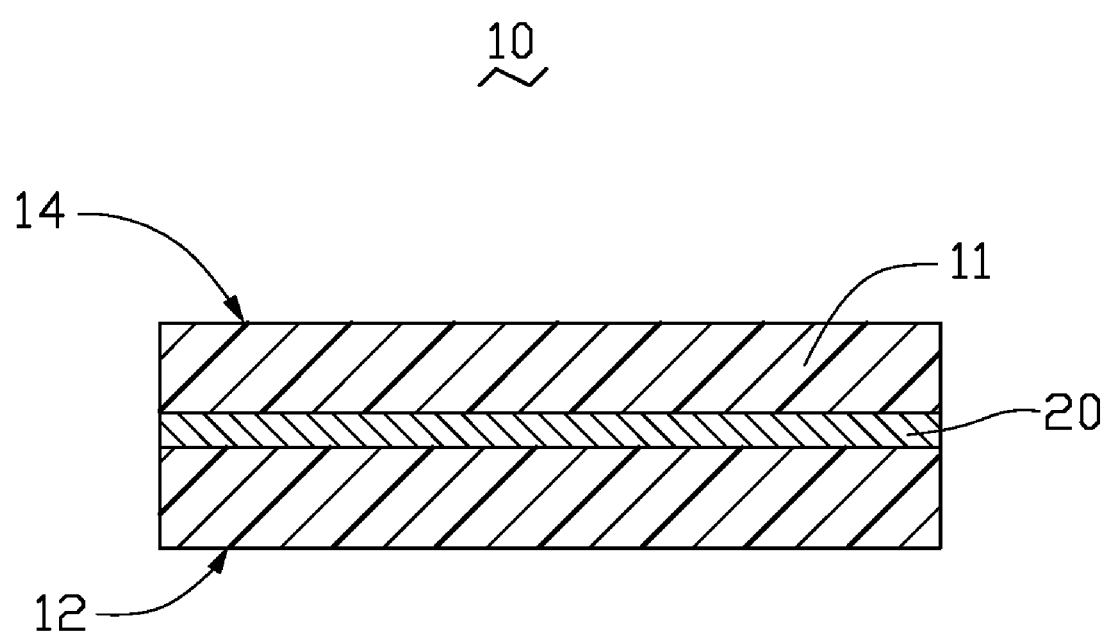
FIG. 1 is a schematic view of an insulation film, in accordance with a present first embodiment.

Referring to FIG. 1, an insulation film 10, in accordance with a first preferred embodiment, is shown. The insulation film 10 is used as a printed circuit board substrate and includes an insulation matrix 11, and a waterproof layer 20 formed in the insulation matrix 11. The insulation matrix 11 includes a first surface 12 and a second surface 14 on opposite sides of the insulation matrix 11. At least one waterproof layer 20 is formed between the first surface 12 and the second surface 14 to separate/divide the first surface 12 and the second surface 14 from each other along a thickness (height) of the insulation matrix 11, thereby preventing molecules or ions migrating/seeping/leaking between the first surface 12 and the second surface 14. In other words, the waterproof layer 20 is provided to avoid an ion migration phenomena happening between the first surface 12 and the second surface 14. In order to realize the separation/division the first surface 12 and the second surface 14, a projection area of the waterproof layer 20 along the thickness of the insulation matrix 11 is equal to a vertical sectional area of the insulation matrix 11, where the waterproof layer 20 is located.

The waterproof layer 20 is made of waterproof materials such as an aluminum foil. When used as the waterproof layer 20, the aluminum foil has many advantages, such as excellent waterproof characteristics, light weight, non-magnetic, low oxidation activity, corrosion resistance, and so on. Therefore, the waterproof layer 20 made of aluminum foil is adopted in the insulation matrix 11 to add the corresponding advantages of the aluminum foil to the waterproof 20.

The insulation film 10 can be used to manufacture either rigid or flexible PCBS. Generally, the PCBS are composed of at least one base film. The base film includes an insulation film and a copper film formed on at least one surface of the insulation film. A thickness of the insulation film is in a range from about 7 mils to about 8 mils (1 mil equals to about 25.4 micrometers), and the thickness of the waterproof layer 20 have a thickness in a range from about 3 micrometers to about 25 micrometers. It is to be understood that any potential variances in the thickness of the waterproof layer 20 are considered to be within the scope of the present insulation film 10, so long as the waterproof layer 20 prevents the ion migration phenomenon from happening between the first surface 12 and the second surface 14.

The insulation matrix 11 can be made of a resin or a prepreg. The resin includes phenolic resin, epoxy resin, polytetrafluoroethylene (PTFE) resin, polymide resin, and so on. The prepreg is a semi-hardened composite sheet made of a fiberglass cloth and one of the above resins. The fiberglass cloth is soaked in one of the resins, e.g., epoxy resin, and is dried, thereby yielding an epoxy prepreg.

The insulation film 10 of the present embodiment is manufactured using a laminating method. First, one waterproof layer 20 and two insulation matrixes 11 are provided. Second, the waterproof layer 20 is clamped between the two insulation matrixes 11. Finally, the two insulation matrixes 11 with the waterproof layer 20 clamped therebetween are laminated by a laminating device, thereby yielding a desired insulation film 10. In the present embodiment, the two insulation matrixes 11 are two fiberglass cloths, and the waterproof layer 20 is an aluminum foil. Moreover, two or more of the waterproof layer 20 can be configured between two insulation matrixes 11 correspondingly to manufacture various insulation films 10.

In other preferred embodiments, the insulation films 10 may have a multi-layered configuration composed of a number of waterproof layers 20 and a number of matrixes 11 laminated in an alternating manner correspondingly. In the multi-layered configuration, the insulation matrix 11 may be resin, prepreg, or the combination thereof. For example, the insulation film 10 includes three insulation matrixes 11 and two waterproof layers 20 clamped between adjacent two insulation matrixes 11 correspondingly. In the three insulation matrixes 11, one of the three insulation matrixes 11 is epoxy prepreg, while the remained of the three insulation matrixes 11 are epoxy resins. It is to be understood that any potential variances in the configuration of the insulation matrix 11 are considered to be within the scope of the insulation film 10, as long as at least one waterproof layer 20 is provided in the insulation film 10 to prevent the ion migration phenomenon from happening between the first surface 12 and the second surface 14.

Figure 2:
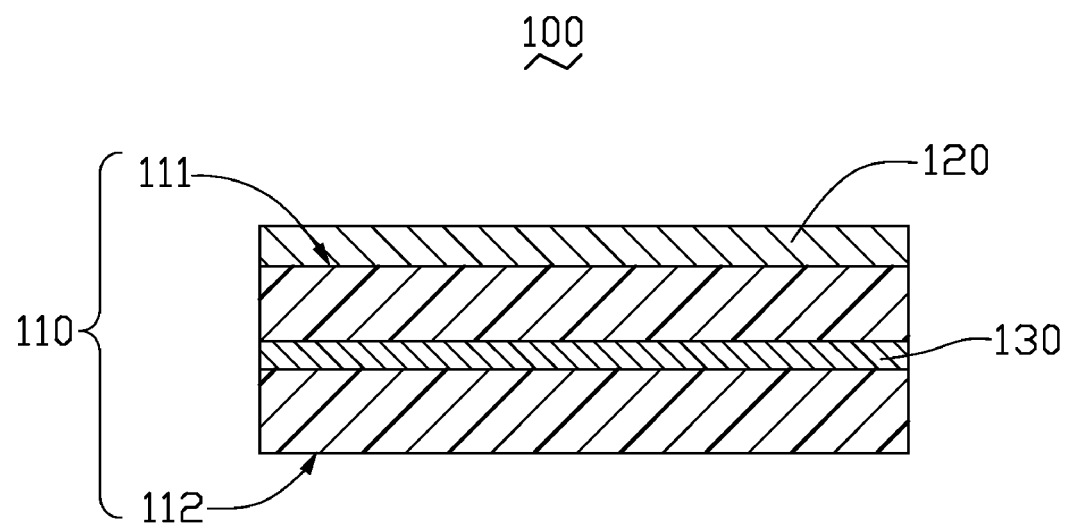
FIG. 2 is a schematic view of a base film, in accordance with a present second embodiment.

Referring to FIG. 2, a base film 100 for manufacturing flexible printed circuit board (FPCB), in accordance with a second embodiment, is shown. The base film 100 is used as a printed circuit board substrate and includes an insulation film 110, an electrically conductive layer 120 formed on at least one surface of the insulation film 110, and at least one waterproof layer 130. The insulation film 110 includes a first surface 111 and a second surface 112 on opposite sides of the insulation film 110. The electrically conductive layer 120 is formed on the first surface 111. The waterproof layer 130 is formed between the first surface 111 and the second surface 112 to separate/divide the first surface 111 and the second surface 112 from each other along a thickness (height) of the insulation film 110, thereby preventing molecules or other ions from migrating/seeping/leaking between the first surface 111 and the second surface 112. In order to achieve this separation/division, a projection area of the waterproof layer 130 along the thickness (height) of the insulation film 110 is equal to a vertical sectional area of the insulation film 110, where the waterproof layer 130 is positioned. When wetting processes such as clearing, etching, electro-plating and so on, is performed on the base film 100, the waterproof layer 130 prevents molecules or other ions migrating from the second surface 112 to the first surface 111 and further reacting with the electrically conductive layer 120. As a result, a natural characteristic of the electrically conductive layer 120 cannot be affected or changed. Especially, when the electrically conductive layer 120 is made into electrical traces, the electrical traces cannot be affected (e.g., cannot causing an open circuit phenomena or a short circuit phenomena).

In the present embodiment, the insulation film 110 is a rectangular sheet, and the waterproof layer 130 is a flat aluminum foil. The waterproof layer 130 is parallel to the first surface 111 and the second surface 112, and is arranged between the first surface 111 and the second surface 112. In the present embodiment, the projection area of the waterproof layer 130 along the thickness (height) of the insulation film 110 is equal to a surface area of the waterproof layer 130. Therefore, the surface area of the waterproof layer 130 is identical with that of either the first surface 111 or the second surface 112. Thus, the waterproof layer 130 separates/divides the first surface 111 and the second surface 112 along the thickness (height) of the insulation film 110. It is to be understood that any potential variances in the shape of the waterproof layer 130 are considered to be within the scope of the present base film 100, as long as the projection area of the waterproof layer 130 along the thickness of the insulation film 110 is equal to a vertical sectional area of the insulation film 110, where the waterproof layer 130 is located.

A thickness of the waterproof layer 130 is determined by the thickness of the insulation 110. In the present embodiment, the thickness of the insulation film 110 is in a range from about 7 mils to about 8 mils (1 mil is about 25.4 micrometers). So the thickness of the waterproof layer 130 is in a range from about 3 micrometers to about 25 micrometers. Certainly, any potential variances in the thickness of the waterproof layer 130 are considered to be within the scope of the present base film 100, as long as the waterproof layer 130 can provide the waterproof function between the opposite surfaces of the insulation film 110. For example, in some base films, the thickness of the waterproof layer 130 can be larger than 25 micrometers or less than 3 micrometers.

The insulation film 110 can be made of a resin, a prepreg or a combination thereof. In the present embodiment, the insulation film 110 is made of prepreg, the electrically conductive layer 120 is a copper foil, and the waterproof layer 130 is an aluminum foil.

A method for manufacturing the base film 100 includes the following steps. Firstly, two prepreg sheets, a waterproof layer 130 and one electrically conductive layer 120 are provided. Secondly, the waterproof layer 130 is clamped between two prepreg sheets. Thirdly, two prepreg sheets with the waterproof layer 130 clamped therebetween are laminated by a laminating device, thereby yielding the desired insulation film 110 having the waterproof layer 130. Finally, the electrically conductive layer 120 is laminated on one surface of the insulation film 110 to obtain the desired base film 100. Certainly, two prepreg sheets, one waterproof layer 130 and one electrically conductive layer 120 can be laminated all at once to form the base film 100.

Figure 3:
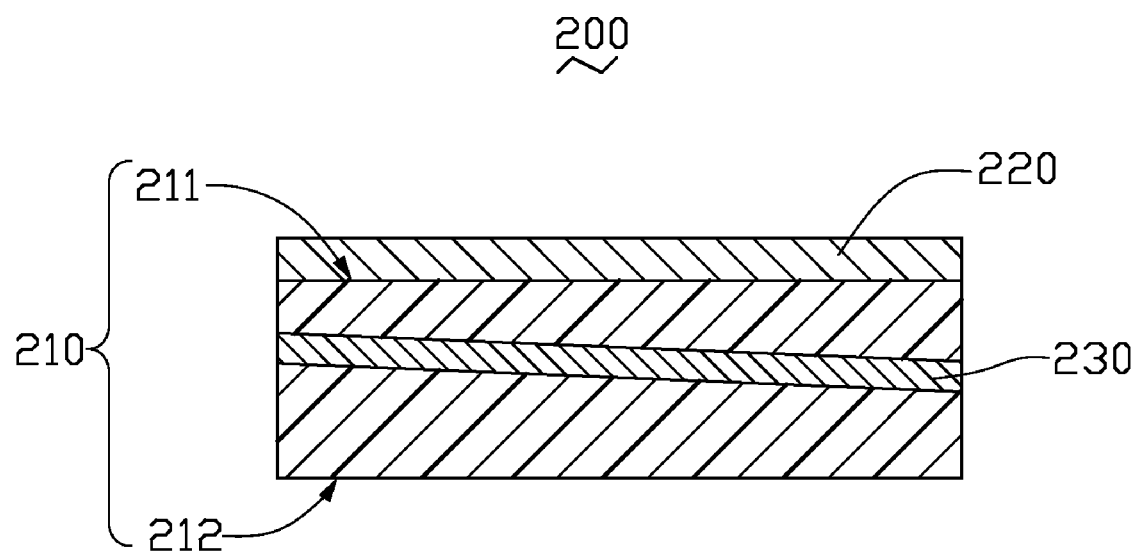
FIG. 3 is a schematic view of a base film, in accordance with a present third embodiment.

Referring to FIG. 3, a base film 200 for manufacturing FPCB, in accordance with a third embodiment, is shown. The base film 200 includes an insulation film 210, a copper layer 220 formed on one surface of the insulation film 210, and a waterproof layer 230 formed in the insulation film 210. The insulation film 210 is a rectangular sheet and includes a first surface 211 and a second surface 212 opposite to the first surface 211. The waterproof layer 230 is a flat sheet of aluminum foil and is slant across in between (e.g., oblique to) the first surface 211 and the second surface 212. A projection area of the waterproof 230 along a horizontal parallel to the first and second surfaces 211 and 212 is equal to the area of either the first surface 211 or the second surface 212. Thus, the waterproof layer 230 partitions the first surface 211 and the second surface 212 along the thickness of the insulation film 210.

Figure 4:
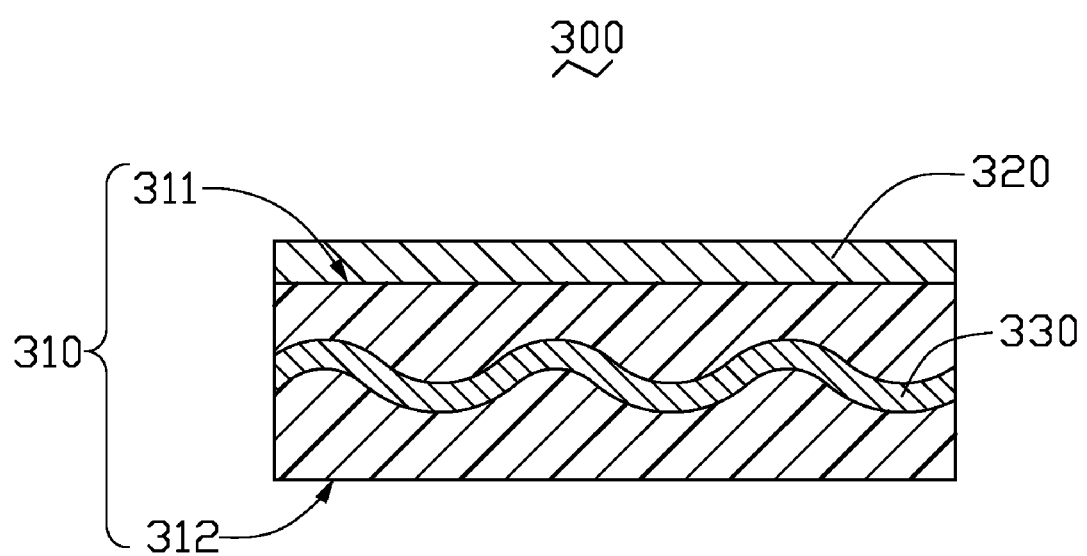
FIG. 4 is a schematic view of a base film, in accordance with a present fourth embodiment.

Referring to FIG. 4, a base film 300 for manufacturing FPCB, in accordance with a fourth embodiment, is shown. The base film 300 includes an insulation film 310, a copper layer 320 formed on one surface of the insulation film 310, and a waterproof layer 330 formed in the insulation film 310. The insulation film 310 is a rectangular sheet and includes a first surface 311 and a second surface 312 opposite to the first surface 311. The waterproof layer 330 is a wave-shaped aluminum foil and is arranged between the first surface 311 and the second surface 312. As a whole, the waterproof layer 330 is parallel to the first and second surfaces 311, 312. A projection area of the waterproof 330 along a horizontal parallel to the first and second surfaces 311, 312 is equal to the area of either the first surface 311 or the second surface 312. Thus, the waterproof layer 330 separates/divides the first surface 311 and the second surface 312 along the thickness of the insulation film 310.

Figure 5:
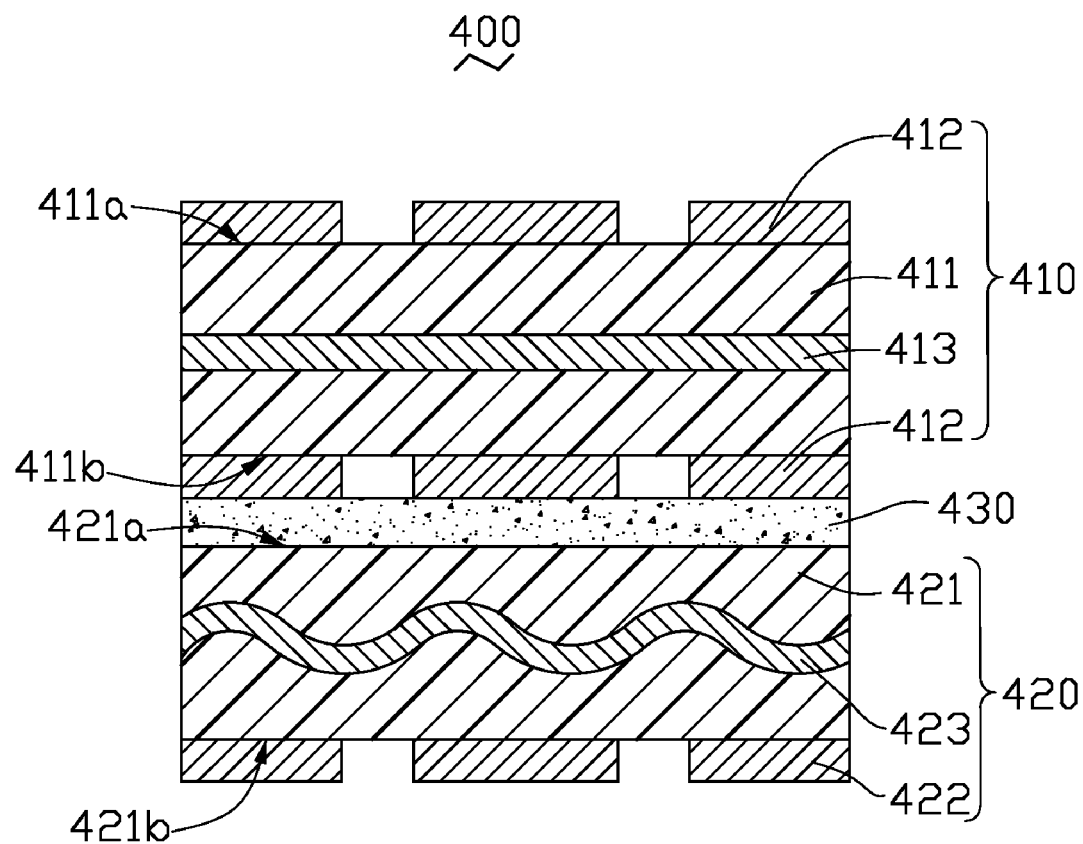
FIG. 5 is a schematic view of a flexible printed circuit board, in accordance with a present fifth embodiment.

Referring to FIG. 5, a FPCB 400, in accordance with a fifth embodiment, is shown. The FPCB 400 can be manufactured by at least one of the above-mentioned base film. In the present embodiment, the FPCB 400 is manufactured by laminating one double-sided FPCB and one single-sided FPCB. In detail, the FPCB 400 includes a first FPCB 410 (i.e., a double-sided FPCB), a second FPCB 420 (i.e., a single-sided FPCB), and an adhesive layer 430 for adhering the first FPCB 410 and the second FPCB 420 together.

The first FPCB 410 includes a first insulation film 411, two first traces 412, and a first waterproof layer 413. The first insulation film 411 is a rectangular sheet and includes a first surface 411a and a second surface 411b on opposite sides of the first insulation film 411. The waterproof layer 413 is arranged between the first surface 411a and the second surface 411b. The waterproof layer 413 is a flat aluminum foil and is parallel to the first surface 411a and the second surface 411b. Two first traces 412 are separately formed on the first surface 411a and the second surface 411b.

The second FPCB 420 includes a second insulation film 421, a second trace 422, and a second waterproof layer 423. The second insulation film 421 is a rectangular sheet and includes a third surface 421a and a fourth surface 421b on opposite sides of the second insulation film 421. The waterproof layer 433 is arranged between the third surface 421a and the fourth surface 421b. The waterproof layer 423 is wave-shaped and is parallel to the third surface 421a and the fourth surface 421b, as a whole. The second trace 422 is formed on the second surface 421b of the second insulation film 421.

The insulation films and the base films can be used in rigid printed circuit boards, flexible printed circuit boards, or rigid-flexible printed circuit boards. In those printed circuit boards, the insulation film thereof includes the waterproof layer. During the wetting processes (e.g., clearing, etching, electroplating and so on) for manufacturing those printed circuit boards, the waterproof layer prevents molecules (e.g., water molecules) or other ions from migrating opposite surfaces of the insulation film and reacting with the electrically conductive layer or traces. Thus, a stability of the manufacturing process can be improved, and the printed circuit boards with excellent water-resistance characteristic have been obtained.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A printed circuit board assembly comprising:
   a first printed circuit board, comprising:
      a first insulation film comprising a first surface and a second surface at an opposite side thereof to the first surface,
      a first waterproof layer formed in the first insulation film and arranged between the first surface and the second surface for blocking water from passing through the first insulation film in a thicknesswise direction thereof, the waterproof layer being a flat aluminum foil and being parallel to the first surface and the second surface, and
      two first traces separately formed on the first and the second surface;
   a second printed circuit board, comprising:
      a second insulation film comprising a third surface and a fourth surface at an opposite side thereof to the third surface,
      a second waterproof layer formed in the second insulation film and arranged between the third surface and the fourth surface for blocking water from passing through the second insulation film in a thicknesswise direction thereof, the waterproof layer being a wave-shaped aluminum foil and being parallel to the third surface and the fourth surface as a whole, and
      a second trace formed on the fourth surface; and
   an adhesive layer adhering the first printed circuit board and the second printed circuit board together.

* * * * *